United States Patent
Epstein

(10) Patent No.: US 10,074,056 B2
(45) Date of Patent: Sep. 11, 2018

(54) QUANTUM OPERATIONS WITH PASSIVE NOISE SUPPRESSION

(71) Applicant: Ryan J. Epstein, Denver, CO (US)

(72) Inventor: Ryan J. Epstein, Denver, CO (US)

(73) Assignee: Northrop Grumman Systems Corporation, Falls Church, VA (US)

(*) Notice: Subject to any disclaimer, the term of this patent is extended or adjusted under 35 U.S.C. 154(b) by 67 days.

(21) Appl. No.: 15/225,210

(22) Filed: Aug. 1, 2016

(65) Prior Publication Data

US 2018/0032894 A1   Feb. 1, 2018

(51) Int. Cl.
*G06N 99/00* (2010.01)
*H03K 19/195* (2006.01)

(52) U.S. Cl.
CPC ......... *G06N 99/002* (2013.01); *H03K 19/195* (2013.01)

(58) Field of Classification Search
None
See application file for complete search history.

(56) References Cited

U.S. PATENT DOCUMENTS

| | | | |
|---|---|---|---|
| 7,893,708 | B2 | 2/2011 | Baumgardner et al. |
| 8,138,784 | B2 | 3/2012 | Przybysz et al. |
| 8,631,367 | B2 | 1/2014 | Pesetski et al. |
| 2005/0224784 | A1* | 10/2005 | Amin ..................... B82Y 10/00 257/14 |
| 2007/0174227 | A1 | 7/2007 | Johnson et al. |
| 2014/0203838 | A1 | 7/2014 | Pesetski et al. |

OTHER PUBLICATIONS

Bacon, et al. . "Adiabatic gate teleportation." *Physical review letters* 103.12 (2009): 120504.
Bacon, "Operator quantum error-correcting subsystems for self-correcting quantum memories." *Physical Review A* 73.1 (2006): 012340.
Douçot, et al. "Protected qubits and Chern-Simons theories in Josephson junction arrays." *Physical Review B* 71.2 (2005): 024505.
Jiang, et al. . "Non-commuting two-local Hamiltonians for quantum error suppression." *arXiv preprint arXiv:*1511.01997(2015).

(Continued)

*Primary Examiner* — Jany Richardson
(74) *Attorney, Agent, or Firm* — Tarolli, Sundheim, Covell & Tummino LLP

(57) ABSTRACT

Systems and methods are provided for performing noise-resilient quantum operations. A set of control signals are applied to a system to provide a first Hamiltonian for the system. The system includes an array of physical qubits and a plurality of coupling mechanisms configured such that each pair of neighboring physical qubits within the array is coupled by an associated coupling mechanism. The first Hamiltonian represents, for each coupling mechanism, a coupling strength between zero and a maximum value. An adiabatic interpolation of the Hamiltonian of the system from the first Hamiltonian to a second Hamiltonian is performed. The second Hamiltonian represents, for at least one of the plurality of coupling mechanisms, a coupling strength different from that of the first Hamiltonian.

19 Claims, 7 Drawing Sheets

(56) References Cited

OTHER PUBLICATIONS

Marvian, et al. . "Error suppression for Hamiltonian-based quantum computation using subsystem codes," *arXiv preprint arXiv:*1606.03795 (2016).
Bartlett, et al: "Simple system for which the ground state is a universal resource for quantum computation", Physical Review A (Atomic, Molecular, and Optical Physics), American Physical Society, USA, vol. 74, No. 4, Oct. 24, 2006 (Oct. 24, 2006), pp. 40302-1, XP002601805, ISSN: 1050-2947, 001:10. 1103/PHYSREVA.74.040302 the whole document.
Hen: "Quantum gates with controlled adiabatic evolutions", Physical Review A (Atomic, Molecular, and Optical Physics), vol. 91, No. 2, Feb. 12, 2015 (Feb. 12, 2015), XP055381110, USA ISSN: 1050-2947, 001:10.1103/PhysRevA.91.022309 Sections II-V.
Warren: "Gates for Adiabatic Quantum Computing", Aug. 26, 2014 (Aug. 26, 2014), XP055438870, Retrieved from the Internet: URL:https://arxiv.org/ftp/arxiv/papers/1405/1405.2354.pdf [retrieved on Jan. 8, 2018] Abstract, section 5.1.
Written Opinion & International Search Report for corresponding PCT/US2017/042844, dated Jan. 22, 2018.

* cited by examiner

US 10,074,056 B2

QUANTUM OPERATIONS WITH PASSIVE NOISE SUPPRESSION

GOVERNMENT INTEREST

The invention was made under US Government Contract Number 30069353. Therefore, the US Government has rights to the invention as specified in that contract.

TECHNICAL FIELD

This invention relates to quantum computing, and more particularly, to performing quantum operations with passive noise suppression.

BACKGROUND

A classical computer operates by processing binary bits of information that change state according to the laws of classical physics. These information bits can be modified by using simple logic gates such as AND and OR gates. The binary bits are physically created by a high or a low signal level occurring at the output of the logic gate to represent either a logical one (e.g., high voltage) or a logical zero (e.g., low voltage). A classical algorithm, such as one that multiplies two integers, can be decomposed into a long string of these simple logic gates. Like a classical computer, a quantum computer also has bits and gates. Instead of using logical ones and zeroes, a quantum bit ("qubit") uses quantum mechanics to occupy both possibilities simultaneously. This ability and other uniquely quantum mechanical features enable a quantum computer can solve certain problems exponentially faster than that of a classical computer.

SUMMARY OF THE INVENTION

In accordance with an aspect of the present invention, a method is provided for performing a quantum operation on a logical qubit that is resilient to noise on control signals, on the individual physical qubits, and on the coupling strengths between physical qubits. A set of control signals are applied to a system to provide a first Hamiltonian for the system, which determines the energies of the quantum states of the system. The system includes an array of physical qubits and a plurality of coupling mechanisms configured such that each pair of neighboring physical qubits within the array is coupled by an associated coupling mechanism. The first Hamiltonian represents, for each coupling mechanism, a coupling strength between zero and a maximum value. An adiabatic interpolation of the Hamiltonian of the system from the first Hamiltonian to a second Hamiltonian is performed. The second Hamiltonian represents, for at least one of the plurality of coupling mechanisms, a coupling strength different from that of the first Hamiltonian.

In accordance with another aspect of the present invention, a system is provided for performing quantum operations on a logical qubit that are to noise on control signals, on the individual physical qubits, and on the coupling strengths between physical qubits. The system includes an array of physical qubits and a plurality of coupling mechanisms configured such that each pair of neighboring physical qubits within the array is coupled by an associated coupling mechanism. A first set of at least one control mechanism is configured to tune respective coupling strengths of the plurality of coupling mechanisms. A second set of at least one control mechanism is configured to selectively apply a local field to each physical qubit of the array of physical qubits as to provide an energy splitting between the states of the physical qubit into eigenstates associated with a quantum operator.

In accordance with yet another aspect of the present invention, a method is provided for performing a quantum operation that is resilient to noise on control signals, on the individual physical qubits, and on the coupling strengths between physical qubits. A system is provided, comprising an array of physical qubits and a plurality of coupling mechanisms configured such that each pair of neighboring physical qubits within the array is coupled by an associated coupling mechanism having a coupling strength tunable between zero and a maximum value. Respective coupling strengths are set for the plurality of coupling mechanisms as to establish a logical qubit comprising a plural set of the array of physical qubits and a set of coupling mechanisms of the plurality of coupling mechanisms that couple the plural set of the array of physical qubits. The coupling strength of at least one of the plurality of coupling mechanisms is adiabatically altered as to provide the quantum operation.

DETAILED DESCRIPTION

The inventor has provided a method to protect quantum information during computation by creating encoded quantum bits using a number of physical quantum bits on a two-dimensional lattice, neighbors of which are strongly coupled using two-qubit interactions. An array of coupled physical qubits forms a composite logical qubit. Quantum gates are achieved at the logical level by coupling and decoupling multiple composite qubits and by applying local fields to individual physical qubits; couplings (also called interactions herein) and fields are turned on and off adiabatically. The encoded qubits and gates are protected from noise acting on individual qubits and coupling strengths between the qubits to a degree that increases with the number of physical qubits comprising the composite qubits and with increasing strength of the interactions. While the illustrated systems and methods can suppress the effects of noise during quantum computation, it is anticipated that a layer of standard error correction would be applied on top of this passive error suppression. These protected qubits and gates then make it possible to achieve errors well below the thresholds for error correction while maintaining much wider margins on control signals than standard techniques. The net result is a system that is easier to build and potentially has lower error correction overhead.

Figure 1:
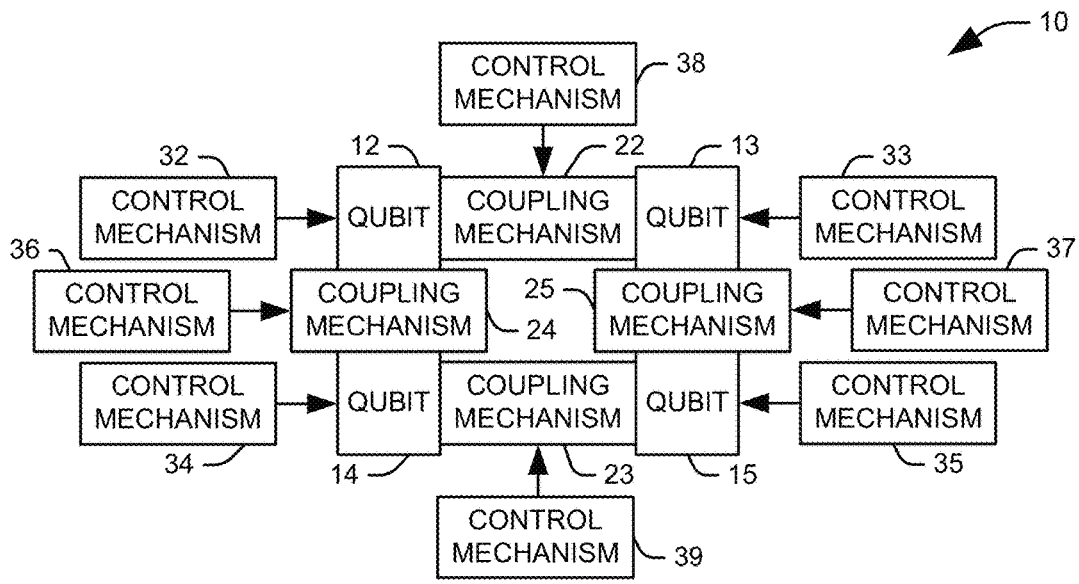
FIG. 1 illustrates one example of system for performing a quantum operation.

FIG. 1 illustrates one example of system 10 for performing a quantum operation. The system includes a plurality of physical qubits 12-15 each coupled to its neighboring qubits by respective coupling mechanisms 22-25. Each of the qubits 12-15 can be implemented in any appropriate quantum technology with the herein-prescribed tunable couplings and single qubit control, including superconducting circuits, such as Cooper pair boxes or flux qubits comprised of Josephson junctions, quantum dots, photonic circuits, ion traps and others. In the illustrated system, four physical qubits are shown in a two-by-two arrangement, but it will be appreciated that other configurations of qubits, including larger arrays containing more physical qubits and arrays that are not square, can be utilized to represent a given logical qubit. For arrays that are rectangular, the strengths of the coupling mechanisms in the shorter dimension can be increased by up to fifty percent relative to the coupling strength in the longer dimension to maintain a suitable gap between a degenerate ground state of the logical qubit and the excited states.

On the two-dimensional array, each qubit (e.g., 12) is operatively coupled to its nearest neighbor (e.g., 13) or neighbors in a first direction, the horizontal direction in the example of FIG. 1, via a first set of coupling mechanisms 22 and 23 each configured such that, when the coupling strength is non-zero, it is energetically favorable for the states of the coupled physical qubits (e.g., 12 and 13) to align in the same direction along a first axis of the Bloch sphere. Similarly, each qubit (e.g., 12) is operatively coupled to its nearest neighbor (e.g., 14) or neighbors in a second direction, the vertical direction in the example of FIG. 1, via a second set of coupling mechanisms 24 and 25 each configured such that, when the coupling strength is non-zero, it is energetically favorable for the states of the coupled physical qubits (e.g., 12 and 14) to align in the same direction along a second axis of the Bloch sphere. It will be appreciated that a given logical qubit can be formed from a combination of multiple physical qubits and coupling mechanism 16 for at least part of the quantum gate, although it will be appreciated that, during a gate operation, the specific qubits and coupling mechanisms comprising the logical qubit can change.

The system 10 further includes a plurality of control mechanisms 32-39 that are each configured to provide a control signal to one of the physical qubits 12-15 or one of the first and second sets of coupling mechanisms 22-25 as to adjust coupling strengths in a Hamiltonian of the logical qubit. Each control mechanism 32-35 that is associated with a given qubit 32-35 is configured to adjust the strength of a field that causes an energy splitting between the states of the qubit associated with an axis of the Bloch sphere, such that a first eigenstate of an operator associated with the axis has a lower energy than a second eigenstate associated with the axis. In one implementation, a given qubit can have multiple control mechanisms. Each control mechanism 36-39 associated with a given coupling mechanism is configured to increase or decrease a coupling strength associated with the coupling mechanism. It will be appreciated that the control mechanisms 32-39 may contain components or circuitry in common, but are depicted as individual elements herein to emphasize that each qubit 12-15 and 22-25 is individually addressable. It will be appreciated that, in one implementation, a default coupling strength is zero, and that the coupling strength will be changed to a non-zero value when a Hamiltonian incorporating that coupling is applied in a given gate. Further, the system 10 can be configured such that, for a given Hamiltonian, if a control mechanism (e.g., 32) is applying a local field of non-zero strength to a given physical qubit (e.g., 12) of the array of physical qubits, the control mechanisms (e.g., 36 and 38) for each coupling mechanism (e.g., 22 and 24) associated with the physical qubit set the respective coupling strengths to zero.

It will be appreciated that the nature of each coupling mechanism 22-25 and control mechanism 32-39 will vary with the implementation and the specific gate performed. Examples of coupling devices include superconducting circuits containing RF-SQUIDs or DC-SQUIDs, which inductively couple qubits together by their flux; the coupling strength can be tuned via a control flux. SQUIDs include a superconducting loop interrupted by one Josephson junction (an RF-SQUID) or two Josephson junctions (a dc-SQUID). The coupling devices may be capable of both ferromagnetic and anti-ferromagnetic coupling, depending on how the coupling device is being utilized within the interconnected topology. In the case of flux coupling, ferromagnetic coupling implies that parallel fluxes are energetically favorable and anti-ferromagnetic coupling implies that anti-parallel fluxes are energetically favorable.

The various gates performed by this system are derived by tracking the evolution of logical operators, providing a powerful way to design Hamiltonians to achieve a desired gate. The interactions used in performing gates create an energy gap with states outside the computational subspace while excitations to states above the gap are suppressed by nearly adiabatic time-evolution and by ensuring that the thermal excitation rate is acceptably low relative to the gate time. This makes the scheme very robust to noise on the strength of Hamiltonian terms since a precise interpolation path is not required to achieve a given gate.

Logical qubits are protected from noise in two ways: first, the energy gap suppresses thermal excitations out of the ground space when the gap is sufficiently large relative to the thermal energy of the logical qubit's environment. Second, noise on individual qubits, which causes an energy splitting of the logical qubit states, is suppressed by approximately $r^d$ where r is the ratio of noise to coupling strengths and d is the number of qubits along the relevant direction of the composite qubit. This noise suppression occurs due to the presence of a degeneracy (or redundancy) of logical operators. Noise that does not commute with a given type of logical operator acts on all physical qubits along a row or column in order to split the energies of the logical qubit states. This is a higher order process than linear, which makes the effect weaker than the same noise acting on an individual physical qubit. The degree of passive noise reduction provided by the system 10 will generally increase with the number of physical qubits comprising a given logical qubit, at the cost of reducing the energy gap between the excited states of the logical qubit and the degenerate ground state in which the gates are performed. This can be mitigated to a great extent by increasing a maximum coupling strength of the coupling mechanisms 22-25, but it may provide a practical limitation of the size of the array used to encode a given logical qubit.

Figure 2:
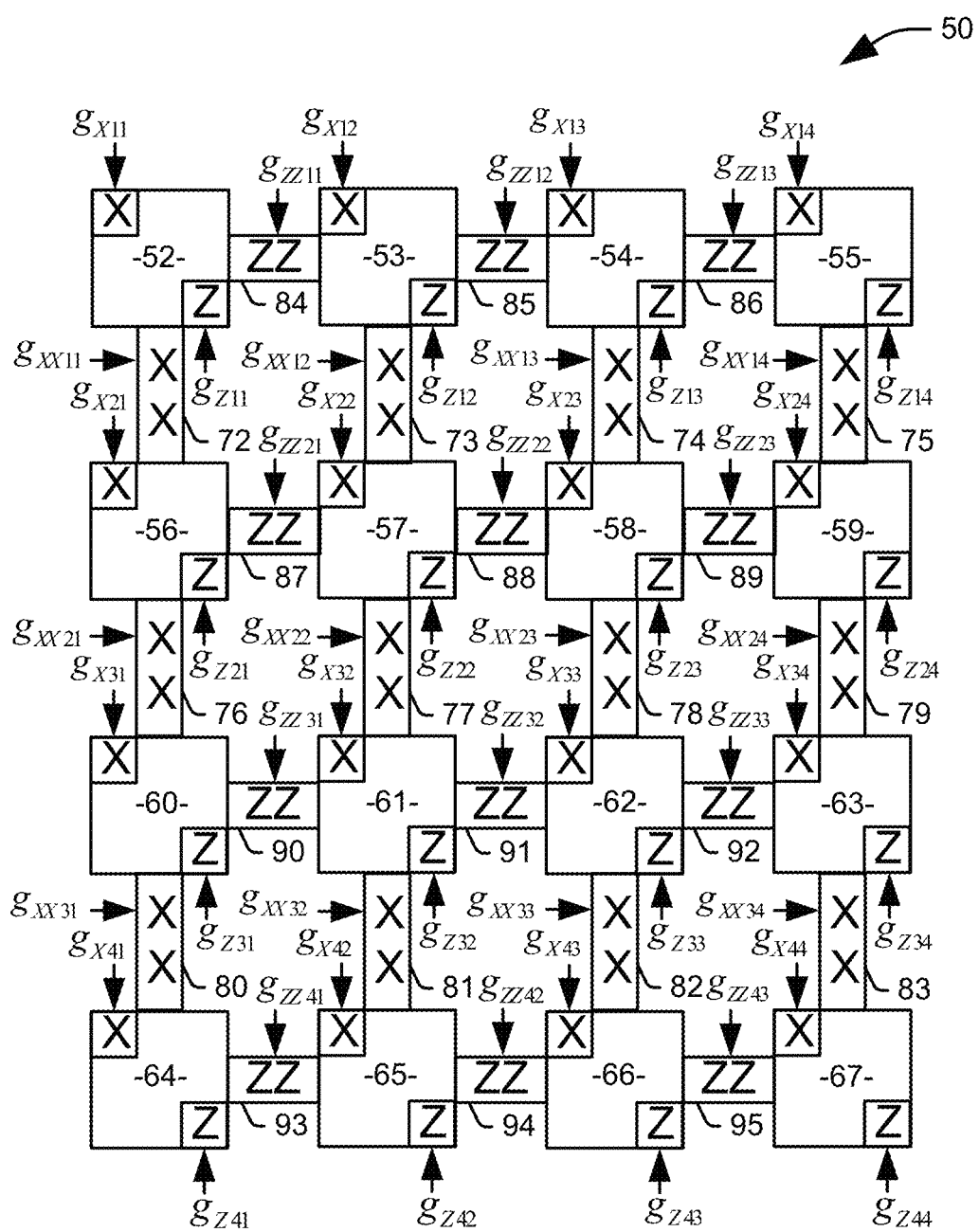
FIG. 2 illustrates an example of an array of physical qubits that could be employed for a series of quantum operations, such as those described in FIGS. 3-8.

FIG. 2 illustrates an example of an array of physical qubits 50 that could be employed for a series of quantum operations, such as those described in FIGS. 3-8 below. In the illustrated array, sixteen physical qubits 52-67 are connected by twenty-four coupling mechanisms 72-95. Each coupling mechanism 72-83 in the vertical direction is an XX coupler configured to align the coupled qubits along an X-axis of the Bloch sphere. Each coupling mechanism 84-95 in the horizontal direction is a ZZ coupler configured to align the coupled qubits along a Z-axis of the Bloch sphere. The XX and ZZ interactions create an energy gap that is proportional to their interaction strengths. Each qubit 52-67 can be exposed to a tunable local field, such as an external magnetic field, to produce an adjustable splitting of the qubit into eigenstates of either of the X-axis or the Z-axis of the Bloch sphere. This can be accomplished by separate control mechanisms or a configurable control mechanism capable of providing the ground state splitting along either axis. Each coupler 72-95 can have a tunable coupling strength controllable via an associated control mechanism.

In the figure, the control mechanisms for the qubits are not shown and are instead each represented as a coupling strength, $g_{Oij}$, adjusted in magnitude via a control signal (also not shown), where O is the axis of the Bloch sphere, X or Z, represented by the signal, i is a row index of the qubit, and j is a column index of the qubit. Similarly, the control mechanism for each ZZ coupler is represented as a coupling strength, $g_{ZZij}$, where i is a row index of the coupler, and j is a column index of the leftmost of the pair of physical qubits coupled by the coupler. The control mechanism for each XX coupler is represented as a coupling strength, $g_{XXij}$, where i is a row index of the uppermost of the pair of physical qubits coupled by the coupler, and j is a column index of the coupler.

In practice, each gate is performed by interpolating from a first Hamiltonian to at least a second Hamiltonian by changing the coupling strengths described above via control signals. The precise temporal profiles of the control signal pulses are not critical as long as the controlled coupling strengths can be turned off close to zero and there is temporal overlap between subsequent control signal pulses such that a sufficiently large energy gap to excited states is maintained relative to the speed of the gate and the temperature of the system. This grants significant robustness to control noise.

Selection of Hamiltonians for a given gate is primarily based on constraining the transformations of the logical operators and controlling the localization of quantum information, while maintaining an energy gap to undesired states. The gaps are verified by calculating the eigenvalues of the system throughout the gate sequence but, as a rule of thumb, interpolating between Pauli terms that anti-commute will generally maintain a gap. As simple examples, $Z \rightarrow X \rightarrow -Z$ maintains a gap, whereas $Z \rightarrow -Z$ does not. Two commutation rules provide the primary constraints on logical operator evolution, specifically logical operators must commute with arbitrarily weighted sums of the relevant two Hamiltonians and all logical operators must have proper commutation relations with each other throughout the gate sequence. Single qubit terms, such as IX, act to expel quantum information from the qubits they act on. In contrast, two-qubit terms act to delocalize the quantum information across the two qubits.

In view of the foregoing structural and functional features described above in FIGS. 1 and 2, example methods will be better appreciated with reference to FIGS. 3-13. While, for purposes of simplicity of explanation, the methods of FIGS. 3-13 are shown and described as executing serially, it is to be understood and appreciated that the present invention is not limited by the illustrated order, as some actions could in other examples occur in different orders and/or concurrently from that shown and described herein.

Figure 3:
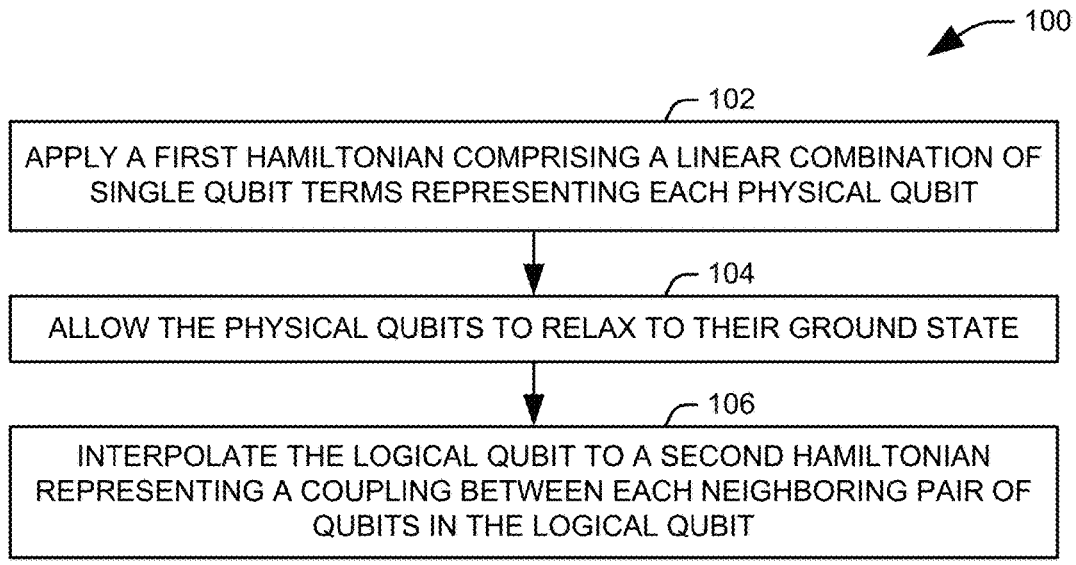
FIG. 3 illustrates a method for qubit state preparation.
Figure 4:
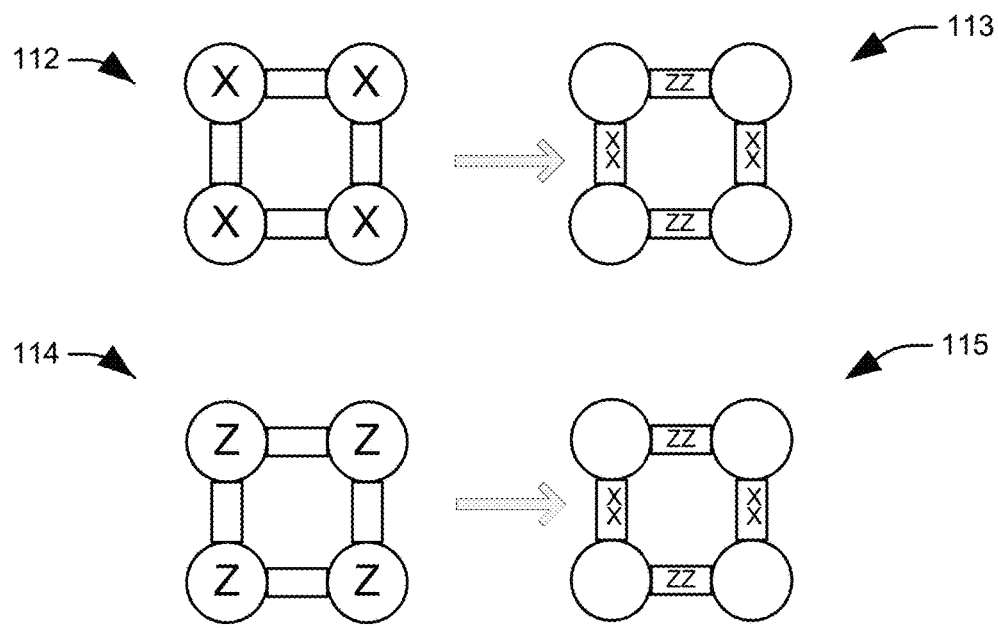
FIG. 4 illustrates the Hamiltonians used in the state preparation of FIG. 3 in graphical form.

FIG. 3 illustrates a method 100 for qubit state preparation using the array of FIG. 2. Specifically, FIG. 3 illustrates a method for preparing a logical qubit in either an eigenstate of the X operator, such as the plus state, $$|+\rangle = \frac{|0\rangle + |1\rangle}{\sqrt{2}},$$

or minus state, $$|-\rangle = \frac{|0\rangle - |1\rangle}{\sqrt{2}},$$

or an eigenstate of the Z operator, such as $|0\rangle$ or $|1\rangle$. The illustrated method focuses on the plus state. Due to the complexity of the Hamiltonians involved, FIG. 4 illustrates the Hamiltonians 112-115 used for the state preparation in graphical form, wherein the presence of an X or a Z field on a given physical qubit represents the application of energy splitting to the physical qubit, and the presence of an XX or a ZZ on a coupling mechanism between represents a non-zero coupling between the qubits. For the purpose of example, the prepared logical qubit is a square array of four physical qubits, and only the portion of the array of FIG. 2 necessary for this implementation is illustrated. FIG. 4 illustrates a state preparation for each of an eigenstate of the X operator (112 and 113) and the Z operator (114 and 115). The specific prepared state for a given operator (e.g., plus or minus) depends on whether the signs of the field strengths in each row match, that is, if the energy splitting induced in the two physical qubits in each row is performed such that each qubit has the same eigenstate with lower energy.

At 102, a first Hamiltonian is applied comprising a linear combination of single qubit terms representing individual fields applied to each physical qubit. In the two examples of FIG. 4, the first Hamiltonians are indicated as 112 and 114. In the example of the plus state and using the notation from FIG. 2, the first Hamiltonian 112 can be described as $H_1 = -g_{X11}XIII - g_{X12}IXII - g_{X21}IIXI - g_{X22}IIIX$. At 104, the physical qubits are allowed to relax to their ground state given the applied Hamiltonian. At 106, the logical qubit is interpolated to a second Hamiltonian representing a coupling between each neighboring pair of qubits in the logical qubit. Effectively, the first Hamiltonian is ramped off while the second Hamiltonian is ramped on. Alternatively, both the first and second Hamiltonians could be turned on at the start and then the first Hamiltonian adiabatically ramped off, achieving the same effect. Again, in the example of the plus state and using the notation from FIG. 2, the second Hamiltonian 113 can be described as $H_2 = -g_{ZZ11}ZZII - g_{ZZ21}IIZZ - g_{XX11}XIXI - g_{XX12}IXIX$. The strength of the two-qubit terms, representing a coupling strength between two qubits, sets the size of the energy gap to excited states and hence the rate at which the gate can proceed to maintain quasi-adiabatic evolution. The rates of the ramps are set by how much excitation out of the ground space can be tolerated. The actual temporal shape and relative timing of the ramps is not critical as long as an energy gap is maintained throughout the gate.

Logical operators $\overline{X}=X_1X_2$ and $X_3X_4$ are both valid logical X operators, $\overline{Z}=Z_1Z_3$ and $Z_2Z_4$ are both valid logical Z operators. Here, subscripts refer to qubits allowing identity operators to be suppressed. The gate works by restricting the logical operator that commutes with the initial Hamiltonian. For the example on the plus state preparation, $H_1$ commutes with $\overline{X}$ but not $\overline{Z}$. Hence, the ground state of the first Hamiltonian will be the +1 eigenstate of the X operator when all signs are the same, which is the plus state. In the illustrated example, changing the sign of one amplitude on each row can be used to prepare the minus state. Readout of the qubit state can be achieved by reversing the method 100 of FIG. 3. Alternatively, the qubit encoding interactions can be turned off and the individual qubits measured by any suitable means.

Figure 5:
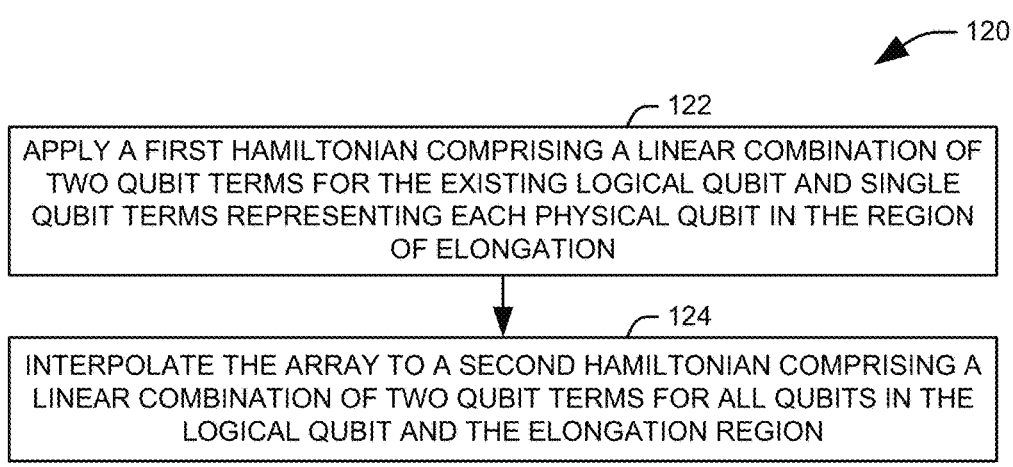
FIG. 5 illustrates a method for qubit elongation.
Figure 6:
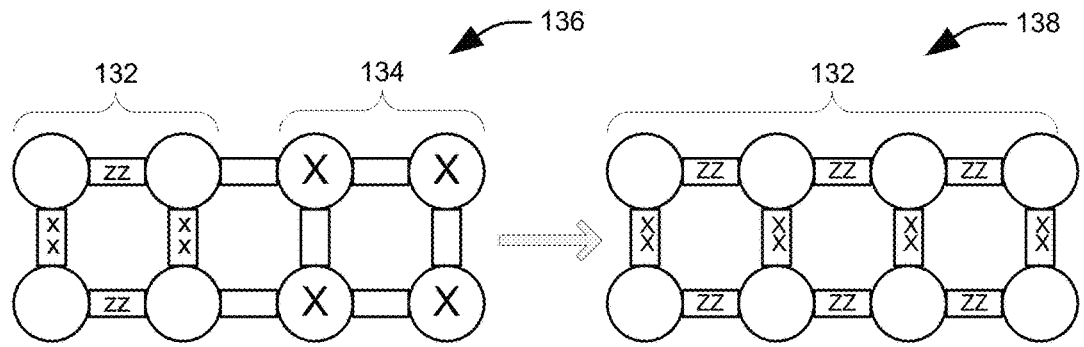
FIG. 6 illustrates the Hamiltonians used in the elongation process of FIG. 5 in graphical form.

FIG. 5 illustrates a method 120 for qubit elongation using the array of FIG. 2. Specifically, FIG. 5 illustrates a method for extending an existing logical qubit 132 into a desired elongation region 134. Due to the complexity of the Hamiltonians involved, FIG. 6 illustrates the Hamiltonians 136 and 138 used for the elongation in graphical form, wherein the presence of an X or a Z on a given physical qubit represents the application of energy splitting to the physical qubit, and the presence of an XX or a ZZ on a coupling mechanism between represents a non-zero coupling between the qubits. For the purpose of example, each of the original logical qubit 132 and the elongation region 134 is a square array of four physical qubits, and only the portion of the array of FIG. 2 necessary for this implementation is illustrated.

At 122, a first Hamiltonian is applied to the array comprising a linear combination of two qubit terms, representing couplings for the qubits within the logical qubit 132, and single qubit terms representing a local field applied to each physical qubit in the elongation region 134. At 124, the array is interpolated to a second Hamiltonian comprising a linear combination of two qubit terms for all qubits in the original logical qubit and the elongation region 134, such that the logical qubit 132 expands to the elongation region. Effectively, the second Hamiltonian represents a coupling between each neighboring pair of qubits in the elongation region in a manner similar to the state preparation of FIG. 3. In the illustrated example, the encoded qubit grows in one direction, and the illustrated method of FIG. 5 can be performed in reverse, that is, interpolating from the second Hamiltonian to the first Hamiltonian, to shrink the qubit. These operations are useful as gate primitives and for moving quantum information around the array. For example, to move the encoded qubit, the logical qubit 132 can be elongated in one direction and then shrunk such that the encoded information has translated to a desired region of the array.

Figure 7:
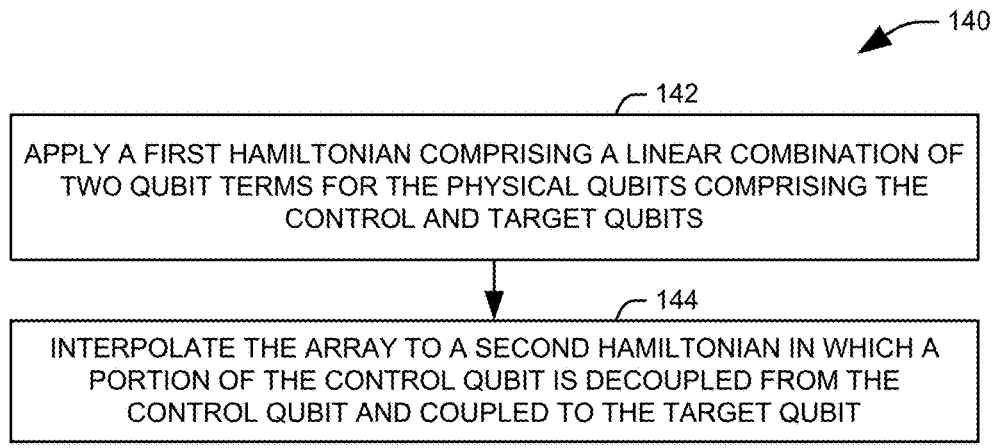
FIG. 7 illustrates a method for performing a CNOT gate.
Figure 8:
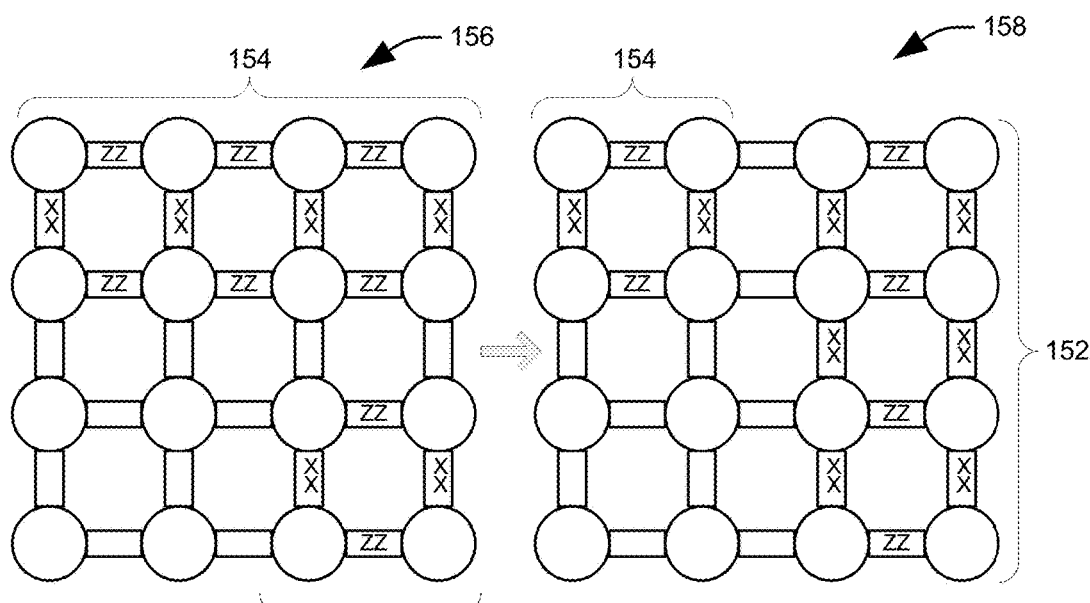
FIG. 8 illustrates the Hamiltonians used in the CNOT gate of FIG. 7 in graphical form.

FIG. 7 illustrates a method 140 for performing a CNOT gate using the array of FIG. 2. Specifically, FIG. 7 illustrates a method for performing a CNOT gate on a target qubit 152 and controlled by a control qubit 154. Due to the complexity of the Hamiltonians involved, FIG. 8 illustrates the Hamiltonians 156 and 158 used for the CNOT gate in graphical form, wherein the presence of an X or a Z on a given physical qubit represents the application of energy splitting to the physical qubit, and the presence of an XX or a ZZ on a coupling mechanism between represents a non-zero coupling between the qubits. For the purpose of example, the target qubit 152 is a square array of four physical qubits, and the control qubit 154 is a two qubit by four qubit rectangular array.

At 142, a first Hamiltonian is applied to the array comprising a linear combination of two qubit terms, representing couplings for the qubits within each of the target qubit 152 and the control qubit 154. At 144, the array is interpolated to a second Hamiltonian in which a portion of the control qubit 154 is decoupled from the remainder of the control qubit and coupled to the target qubit 152. In the illustrated example, a square two-qubit block of the control qubit 154 is decoupled from the control qubit and coupled to the target qubit 152.

Figure 9:
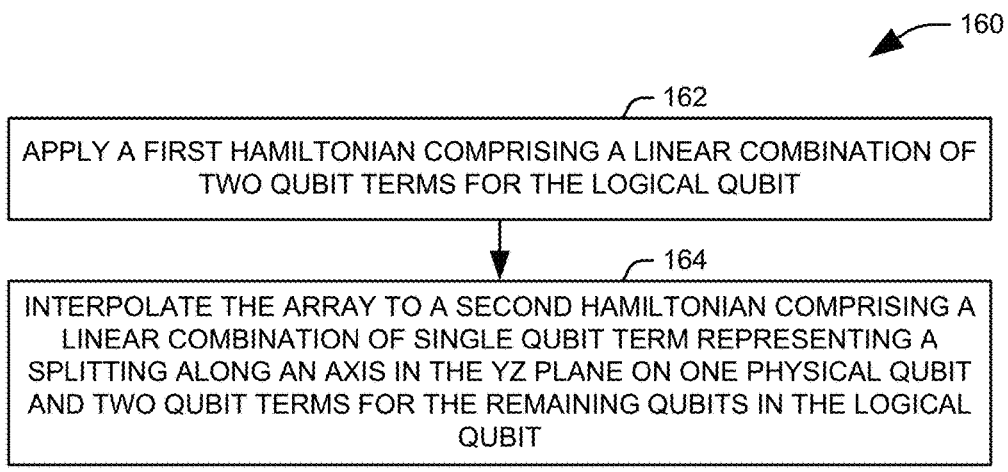
FIG. 9 illustrates a method for performing a non-Clifford rotation of a qubit state.
Figure 10:
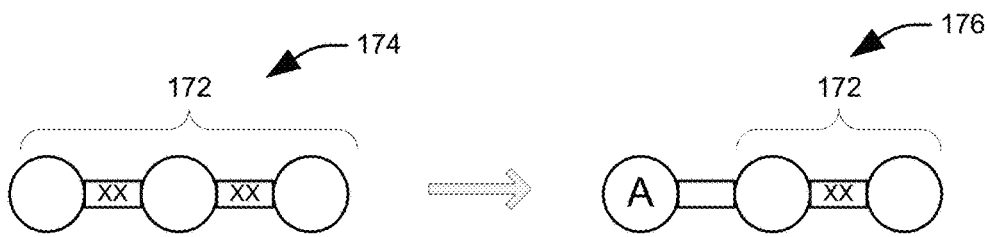
FIG. 10 illustrates the Hamiltonians used in the state rotation of FIG. 9 in graphical form.

FIG. 9 illustrates a method 160 for performing a non-Clifford rotation gate. Rather than using the array of FIG. 2, this method 160 assumes that a control mechanism is available for providing a splitting along the Y-axis of the Bloch sphere for at least one of the physical qubits. Due to the complexity of the Hamiltonians involved, FIG. 10 illustrates the Hamiltonians 156 and 158 used for the state rotation in graphical form, wherein the presence of an A on a given physical qubit represents the application of energy splitting to the physical qubit along the Y and Z axes of the Bloch sphere, such that $A=aY+bZ$, and $a^2+b^2=1$, and the presence of an XX on a coupling mechanism between represents a non-zero coupling between the qubits. For the purpose of example, the initial logical qubit 172 is an array of three physical qubits.

At 162, a first Hamiltonian is applied to the array comprising a linear combination of two qubit terms, representing couplings for the qubits within the logical qubit 172. At 164, the array is interpolated to a second Hamiltonian comprising a linear combination of a single qubit term representing a splitting along the Y and Z axes of the Bloch sphere via a local field and two qubit terms for the remaining qubits in the logical qubit. To understand the operation of this gate, it is helpful to consider the valid logical Z operators that commute with both Hamiltonians, $\overline{Z} \in \{ZZZ, -ZYY, -YZY, -YYZ\}$. The last three can be obtained from ZZZ by multiplying the terms of the first Hamiltonian to ZZZ individually and together. Representing $\overline{Z}$ in terms of the logical operators for the second Hamiltonian, denoted by primes, $\overline{Y}' \in \{Y_2Z_3, -Z_2Y_3\}$, $\overline{Z}' \in \{Z_2Z_3, -Y_2Y_3\}$ and the operator $A_1$, one obtains $\overline{Z} = -aA_1 \overline{Y}' - bA_1\overline{Z}'$. When the second Hamiltonian becomes active, quantum information that was delocalized across all three qubits is expelled from the first physical qubit, and the logical Z operator is transformed to $-a\overline{Y}' - b\overline{Z}'$ while $\overline{X}$ is unchanged, which is exactly the transformation for a rotation around the X axis by an angle $\cos^{-1}b$.

Figure 11:
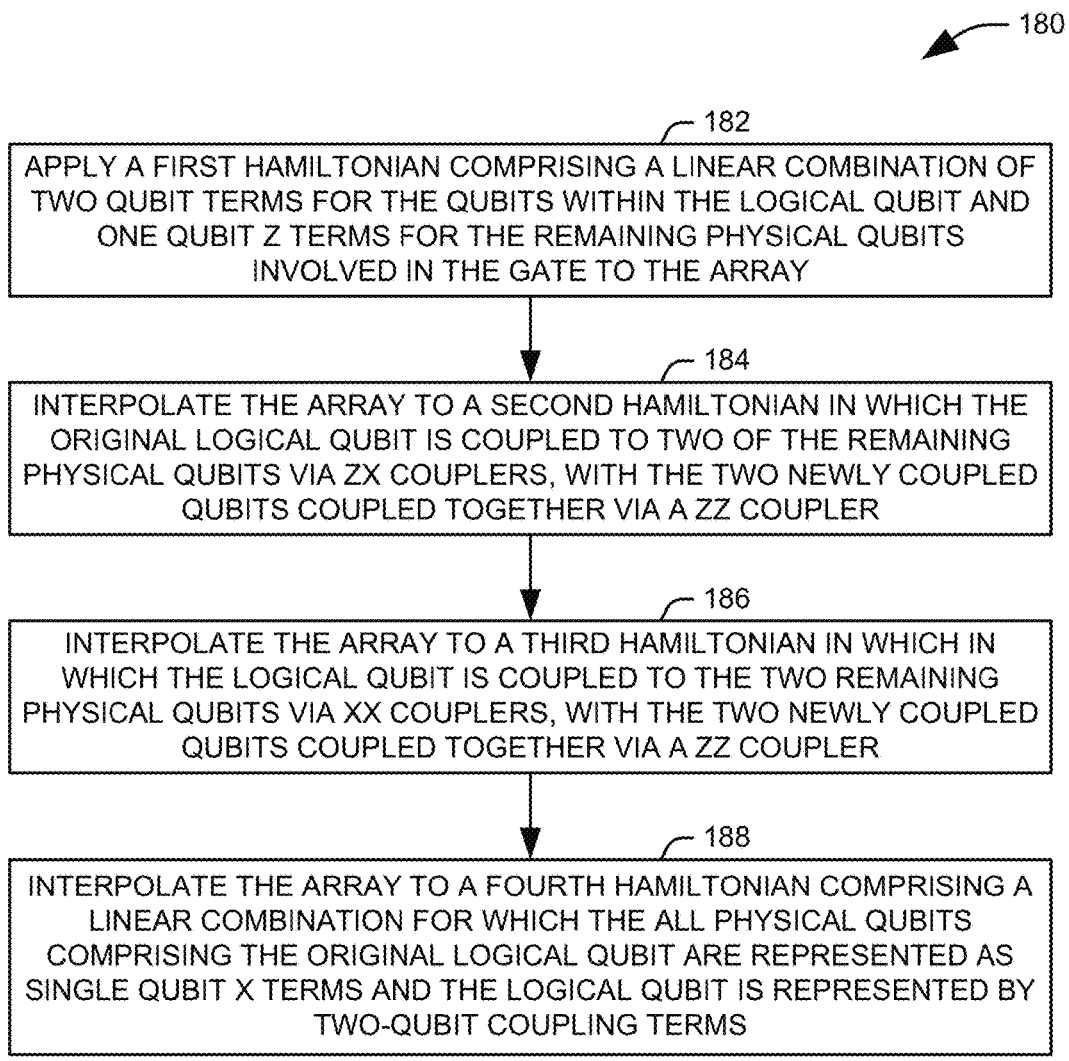
FIG. 11 illustrates a method for performing a Hadamard gate.
Figure 12:
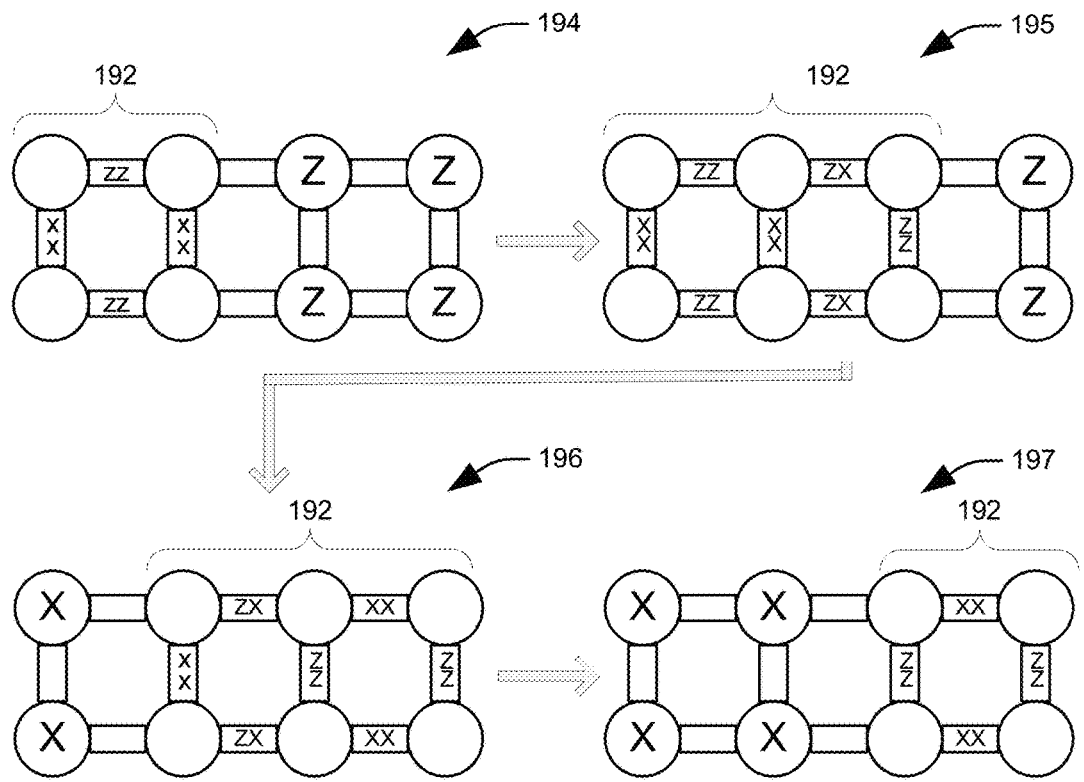
FIG. 12 illustrates the Hamiltonians used in the Hadamard gate of FIG. 11 in graphical form.

FIG. 11 illustrates a method 180 for performing a Hadamard gate on a logical qubit 192. Rather than using the array of FIG. 2, this method 160 assumes that the coupling mechanisms linking the second and third columns of physical qubits are configured to provide a ZX coupling instead of the ZZ coupling of FIG. 2, the vertical coupling mechanisms in the third and fourth columns are ZZ couplers, and the horizontal coupling between the third and fourth columns are XX couplers. Due to the complexity of the Hamiltonians involved, FIG. 12 illustrates the Hamiltonians 194-197 used for the Hadamard gate in graphical form, wherein the presence of an X or a Z on a given physical qubit represents the application of energy splitting to the physical qubit, and the presence of an XX, a ZX, or a ZZ on a coupling mechanism between represents a non-zero coupling between the qubits. For the purpose of example, the initial logical qubit 192 is a square array of four physical qubits.

At 182, a first Hamiltonian is applied to the array comprising a linear combination of two qubit terms, representing couplings for the qubits within the logical qubit 192, and one qubit Z terms for the remaining physical qubits involved in the gate. At 184, the array is interpolated to a second Hamiltonian in which the original logical qubit is coupled to two of the remaining physical qubits via ZX couplers, with the two newly coupled qubits coupled together via a ZZ coupler. At 186, the array is interpolated to a third Hamiltonian in which the logical qubit is coupled to the two remaining physical qubits via XX couplers, with the two newly coupled qubits coupled together via a ZZ coupler. In the third Hamiltonian, two of the physical qubits from the logical qubit are also decoupled and single qubit X fields are applied. At 188, the array is interpolated to a fourth Hamiltonian comprising a linear combination for which the all physical qubits comprising the original logical qubit are represented as single qubit X terms and the logical qubit is represented by two-qubit coupling terms. Effectively, the Hadamard gate is generated by elongating the encoded logical qubit 192 through a boundary between two code blocks where the interactions of the second block are rotated 90 degrees relative to the first. Once the Hadamard gate is complete, an elongation gate can be applied while turning a 90 degree corner to reorient the code block to match that of the left block.

The Hadamard gate can also be achieved in fewer steps by elongating from the same initial Hamiltonian to the fully coupled 2×4 composite qubit in one interpolation step and then shrinking down and moving the logical qubit to the right-most 2×2 qubit block in the second interpolation step. This alternative method requires greater qubit elongation, 2×4 instead of 2×3, which will have a smaller energy gap to excited states for the same coupling strengths.

Figure 13:
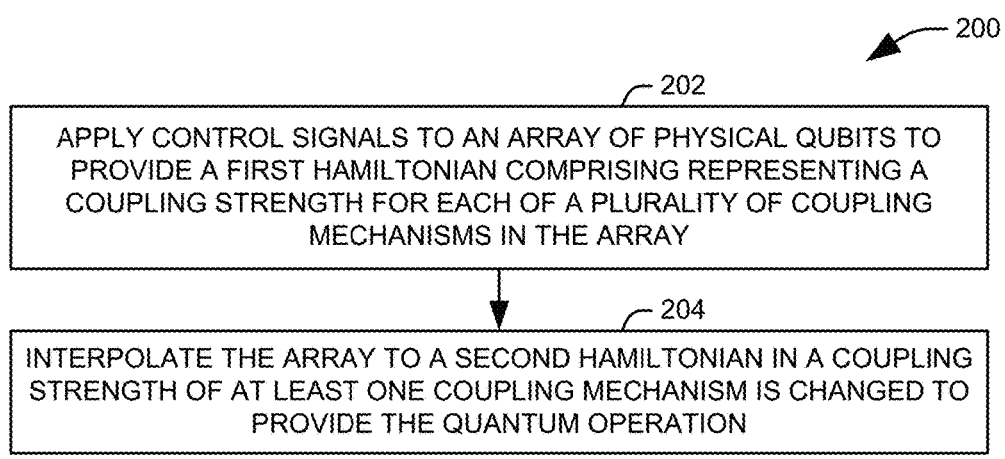
FIG. 13 illustrates one example of a method for performing a quantum operation.

FIG. 13 illustrates one example of a method 200 for performing a quantum operation. At 202, a set of control signals are applied to a system to provide a first Hamiltonian for the system. The system includes an array of physical qubits and a plurality of coupling mechanisms configured such that each pair of neighboring physical qubits within the array is coupled by an associated coupling mechanism. The first Hamiltonian represents, for each coupling mechanism, a coupling strength between zero and a maximum value. At 204, an adiabatic interpolation of the Hamiltonian of the system from the first Hamiltonian to a second Hamiltonian is performed. The second Hamiltonian represents, for at least one of the plurality of coupling mechanisms, a coupling strength different from that of the first Hamiltonian.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications, and variations that fall within the scope of the appended claims.

What is claimed is:

1. A method for performing a quantum operation on a logical qubit, comprising a plurality of physical qubits, that is resilient to noise on control signals, on the individual physical qubits, and on the coupling strengths between physical qubits, the method comprising:

applying a set of control signals to provide a first Hamiltonian for a system comprising an array of physical qubits, the array of physical qubits including at least the plurality of physical qubits, and a plurality of coupling mechanisms, each coupling mechanism operatively coupling only an associated pair of neighboring physical qubits within the array, the first Hamiltonian representing, for each coupling mechanism, a coupling strength between zero and a maximum value;

performing an adiabatic interpolation of the Hamiltonian of the system from the first Hamiltonian to a second Hamiltonian, the second Hamiltonian representing, for at least one of the plurality of coupling mechanisms, a coupling strength different from that of the first Hamiltonian.

2. The method of claim 1, wherein the quantum operation is a state preparation for the logical qubit, comprising a plurality of physical qubits from the array of physical qubits, to an eigenstate associated with a Pauli operator and the first Hamiltonian comprises a set of single qubit terms representing a splitting of the energy state of each physical qubit comprising the logical qubit into eigenstates of the Pauli operator and the second Hamiltonian represents a non-zero coupling strength for each coupling mechanism connecting two physical qubits in the logical qubit.

3. The method of claim 2, wherein the Pauli operator is the X operator and the eigenstate is one of the plus and the minus states.

4. The method of claim 2, wherein the Pauli operator is the Z operator and the eigenstate is one of the $|0\rangle$ and $|1\rangle$ states.

5. The method of claim 1, wherein the quantum operation is a read operation on the logical qubit, comprising a plurality of physical qubits from the array of physical qubits, and the first Hamiltonian represents a non-zero coupling strength for each coupling mechanism connecting two physical qubits in the logical qubit and the second Hamiltonian comprises a set of single qubit terms representing a splitting of the energy state of each physical qubit comprising the logical qubit into eigenstates of a Pauli operator.

6. The method of claim 1, wherein the quantum operation is an elongation of the logical qubit, comprising a plurality of physical qubits from the array of physical qubits, into a defined elongation region and the first Hamiltonian comprises a set of single qubit terms representing a splitting of the ground energy state of each physical qubit within the elongation region into eigenstates of a Pauli operator and the second Hamiltonian represents a non-zero coupling strength for each coupling mechanism connecting two physical qubits in the elongation region.

7. The method of claim 1, wherein the quantum operation is a contraction of the logical qubit, comprising a plurality of physical qubits from the array of physical qubits, and the first Hamiltonian represents a non-zero coupling strength for each coupling mechanism connecting two physical qubits in the logical qubit and the second Hamiltonian comprises a set of single qubit terms representing a splitting of the ground energy state of each physical qubit within a region to be contracted into eigenstates of a Pauli operator and a set of two-qubit qubit terms defining a non-zero coupling strength for each coupling mechanism connecting two physical qubits in a remainder of the logical qubit.

8. The method of claim 1, wherein the quantum operation is a CNOT gate on a target logical qubit, comprising the logical qubit, using a control logical qubit, comprising a second plural set of physical qubits from the array of physical qubits, the first Hamiltonian comprising a set of two-qubit terms representing a non-zero coupling strength for each coupling mechanism connecting two physical qubits in each of the control qubit and the target qubit, and the second Hamiltonian comprises a term representing a zero coupling strength for at least one coupling mechanism connecting two physical qubits in the control qubit and a non-zero coupling strength for at least one coupling mechanism connecting at least one physical qubit in the control qubit to corresponding physical qubits in the target qubit, such that a portion of the control qubit is decoupled from the control qubit and coupled to the target qubit.

9. The method of claim 1, wherein the quantum operation is a non-Clifford rotation gate on the logical qubit and the first Hamiltonian comprises a set of two-qubit terms representing a non-zero coupling strength for each coupling mechanism connecting two physical qubits in each of the control qubit and the second Hamiltonian comprises a single qubit term representing a splitting of the ground energy state around an axis on the Bloch sphere defined by a desired angle of the non-Clifford rotation for a physical qubit in the logical qubit and a two-qubit qubit term defining a non-zero coupling strength for a coupling mechanism connecting two physical qubits in a remainder of the logical qubit.

10. The method of claim 9, wherein the axis on the Bloch sphere comprises each of the Y axis and the Z axis, and the rotation can be represented by an operator $A=aY+bZ$, where $a^2+b^2=1$ and b is the cosine of the desired angle.

11. The method of claim 1, wherein the quantum operation is a Hadamard gate on the logical qubit, comprising a plurality of physical qubits from the array of physical qubits, a first set of XX coupling mechanisms of the plurality of coupling mechanisms that couple each physical qubit to a nearest neighbor in a first direction on the array, and a first set of ZZ coupling mechanisms of the plurality of coupling mechanisms that couple each physical qubit to a nearest neighbor in a second direction on the array, where the first Hamiltonian comprises a set of single qubit terms representing a splitting of the ground energy state of a plurality of physical qubits within an elongation region of the array outside the logical qubit into eigenstates of a Pauli operator and non-zero coupling values for each of the first set of XX coupling mechanisms and the first set of ZZ coupling mechanisms, and the second Hamiltonian represents a non-zero coupling for a second set of at least one ZZ coupling mechanism that couple at least two physical qubits in the elongation region in the first direction.

12. The method of claim 11, further comprising performing an adiabatic interpolation of the Hamiltonian of the system from the second Hamiltonian to a third Hamiltonian comprising a set of single qubit terms representing a splitting of the ground energy state of each physical qubit comprising the original logical qubit into eigenstates of a Pauli operator and a set of two-qubit qubit terms defining a non-zero coupling strength for each coupling mechanism in the second set of at least one ZZ coupling mechanism and second set of at least one XX coupling mechanism of the plurality of coupling mechanisms that couple at least two physical qubits in the elongation region in the second direction.

13. The method of claim 11, further comprising:
performing an adiabatic interpolation of the Hamiltonian of the system from the second Hamiltonian to a third Hamiltonian comprising a set of single qubit terms representing a splitting of the ground energy state of a proper subset of the physical qubits comprising the original logical qubit into eigenstates of a Pauli X operator and a set of two-qubit qubit terms defining a non-zero coupling strength for a set of ZX coupling mechanisms of the plurality of coupling mechanisms that each couple a physical qubit from the original logical qubit to a physical qubit of the elongation region; and
performing an adiabatic interpolation of the Hamiltonian of the system from the third Hamiltonian to a fourth Hamiltonian comprising a set of single qubit terms representing a splitting of the ground energy state of each physical qubit within the original logical qubit into eigenstates of a Pauli operator and a set of two-qubit qubit terms defining a non-zero coupling strength for each coupling mechanism in the second set of at least one ZZ coupling mechanism and second set of at least one XX coupling mechanism that couple at least two physical qubits in the elongation region in the second direction.

14. A system for performing quantum operations on a logical qubit, comprising a plurality of physical qubits, that are resilient to noise on control signals, on the individual physical qubits, and on the coupling strengths between physical qubits comprising:
an array of physical qubits, the array including at least the plurality of physical qubits;
a plurality of coupling mechanisms configured such that each coupling mechanism coupling only an associated pair of neighboring physical qubits within the array, the coupling mechanism comprising a set of XX coupling mechanisms that couple each pair of neighboring physical qubits along a first direction of the array and a set of ZZ coupling mechanisms that couple each pair of neighboring physical qubits along a second direction of the array;
a first set of at least one control mechanism configured to tune respective coupling strengths of the plurality of coupling mechanisms; and
a second set of at least one control mechanism configured to selectively apply a local field to each physical qubit of the array of physical qubits as to provide an energy splitting between the states of the physical qubit into eigenstates associated with a quantum operator.

15. The system of claim 14, wherein at least one control mechanism of the second set of at least one control mechanism is configured to provide an energy splitting between the states of the physical qubit associated with the operator A, $A=aY+bZ$, $a^2+b^2=1$, and Y and Z are Pauli operators.

16. The system of claim 14, wherein each of the first set of at least one control mechanism and the second set of at least one control mechanism are configured to provide a first Hamiltonian for the system such that each pair of neighboring physical qubits within the array is coupled by an associated coupling mechanism, the first Hamiltonian representing, for each coupling mechanism, a coupling strength between zero and a maximum value and perform an adiabatic interpolation of the Hamiltonian of the system from the first Hamiltonian to a second Hamiltonian, the second Hamiltonian representing, for at least one of the plurality of coupling mechanisms, a coupling strength different from that of the first Hamiltonian.

17. The system of claim 14, wherein the array of physical qubits is a first array of physical qubits, the set of XX coupling mechanisms is a first set of XX coupling mechanisms, and the set of ZZ coupling mechanisms is a first set of ZZ coupling mechanisms and the system further comprising a second array of physical qubits, a second set of XX coupling mechanisms that couple each pair of neighboring physical qubits in the second array of physical qubits along the second direction, a second set of ZZ coupling mechanisms that couple each pair of neighboring physical qubits within the second array of physical qubits along the first direction, and a set of ZX couplers that each link a physical qubit from the first array of physical qubits to a physical qubit of the second array of physical qubits.

18. A method for performing a quantum operation on a logical qubit, comprising a plurality of physical qubits, that is resilient to noise on control signals, on the individual physical qubits, and on the coupling strengths between physical qubits comprising:
   providing a system comprising an array of physical qubits and a plurality of coupling mechanisms configured such that each pair of neighboring physical qubits within the array is coupled by an associated coupling mechanism having a coupling strength tunable between zero and a maximum value;
   setting respective coupling strengths for the plurality of coupling mechanisms as to establish the logical qubit, the plurality of physical qubits comprising a plural set of the array of physical qubits and the logical qubit further comprising a set of coupling mechanisms of the plurality of coupling mechanisms that couple the plural set of the array of physical qubits; and
   adiabatically altering the coupling strength of at least one of the plurality of coupling mechanisms as to provide the quantum operation.

19. The method of claim 18, further comprising applying a local field to at least one physical qubit of the array of physical qubits to provide an energy splitting between the states of the physical qubit into eigenstates associated with a quantum operator.

* * * * *